United States Patent [19]

Tasch, Jr. et al.

[11] Patent Number: 5,012,306
[45] Date of Patent: Apr. 30, 1991

[54] HOT-CARRIER SUPPRESSED SUB-MICRON MISFET DEVICE

[75] Inventors: Aloysious F. Tasch, Jr.; Hyungsoon Shin; Christine M. Maziar, all of Austin, Tex.

[73] Assignee: Board or Regents, The University of Texas System, Austin, Tex.

[21] Appl. No.: 410,979

[22] Filed: Sep. 22, 1989

[51] Int. Cl.$^5$ ................. H01L 29/10; H01L 29/68
[52] U.S. Cl. ................... 357/23.4; 357/23.3; 357/23.6
[58] Field of Search ............... 357/23.3, 23.4, 23.6

[56] References Cited

U.S. PATENT DOCUMENTS

| | | | |
|---|---|---|---|
| 4,291,321 | 9/1980 | Pfleidorer et al. | 357/23.3 |
| 4,557,036 | 12/1985 | Kyuragi et al. | 357/23.9 |

FOREIGN PATENT DOCUMENTS

| | | | |
|---|---|---|---|
| 0195607 | 9/1986 | European Pat. Off. | 357/23.3 |
| 0022372 | 2/1985 | Japan | 357/23.3 |
| 0105868 | 5/1986 | Japan | 357/23.3 |
| 0217665 | 9/1987 | Japan | 357/23.3 |
| 0044768 | 2/1988 | Japan | 357/23.3 |

OTHER PUBLICATIONS

Natori et al., "An Analysis of the Concave MOSFET," IEEE, vol. ED-25, No. 4, Apr. 1978.
K. Sunouchi et al., "Double LDD Concave (DLC) Structure Sub-Half Micron MOSFET", IEEE, IEDM, pp. 226-229, 1988.
Salama, "A New Short Channel MOSFET Structure (UMOST)," Solid-State Electronics, 1977, vol. 20, pp. 1003-1009.
Nishimatsu et al., "Grooved Gate MOSFET," Japanese Journal of Applied Physics, vol. 16, 1977, pp. 179-183.
Takeda et al., "New Grooved-Gate MOSFET with Drain Separated from Channel Implanted Region (DSC)," IEEE Transactions on Electron Devices, vol. ED-30, No. 6, Jun. 1983.
"Submicrometer MOSFET Structure for Minimizing Hot Carrier Gen.", Takeda et al., Ed, vol. ED-29, No. 4, 4/82.
"Characterization of AS-P Double Diffused Drain MOSFET for VLSIS", Balasubramanyam et al., IEDM 33.5, pp. 782-785, 1984.
"An AS-P (N+-N-) Double Diffused Drain MOSFET for ULSIS", Lakeda et al., Central Research Lab, pp. 40-41.
"Submicron MOSFET Structure for Minimizing Channel Hot Electron Injection", Takeda et al., VLSI Tech Digest, pp. 22-23.

Primary Examiner—Rolf Hille
Assistant Examiner—Wael Fahmy
Attorney, Agent, or Firm—Henry K. Woodward

[57] ABSTRACT

Hot-carrier suppression in a sub-micron MISFET structure is achieved by providing a drain region which includes a steeply profiled N+ (or P+) doped region in the surface of a semiconductor body with a first epitaxial layer formed thereover having N− (or P−) dopant concentration. A second N+ (or P+) epitaxial layer is formed over the first epitaxial layer and functions as a low ohmic contact to the drain region. In a preferred embodiment both the source and drain regions have dopant concentrations provided by N+ (or P+) doped regions in the surface of a substrate with epitaxial layers thereover. The dopant profile reduces the voltage drop across the more highly doped region of the drain and thereby reduces the electric field therein. Further, the reduction in dopant concentration reduces the electric field due to energy band bending associate with the change in doping level from the N+ (P+) region to the N− (P−) epitaxial layer. The resulting sub-micron device has better long-term reliability. The epitaxial layers are adjacent to and spaced from the gate contact by a dielectric layer such as silicon oxide. In a preferred embodiment, the dielectric layer is thicker between the second epitaxial layer and the gate contact than between the first epitaxial layer and the gate contact.

44 Claims, 5 Drawing Sheets

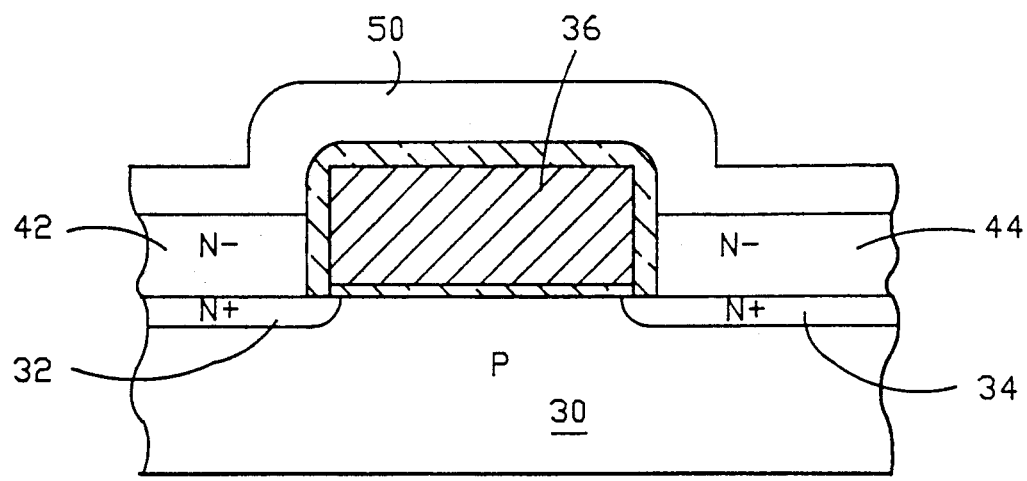
FIG.—4A
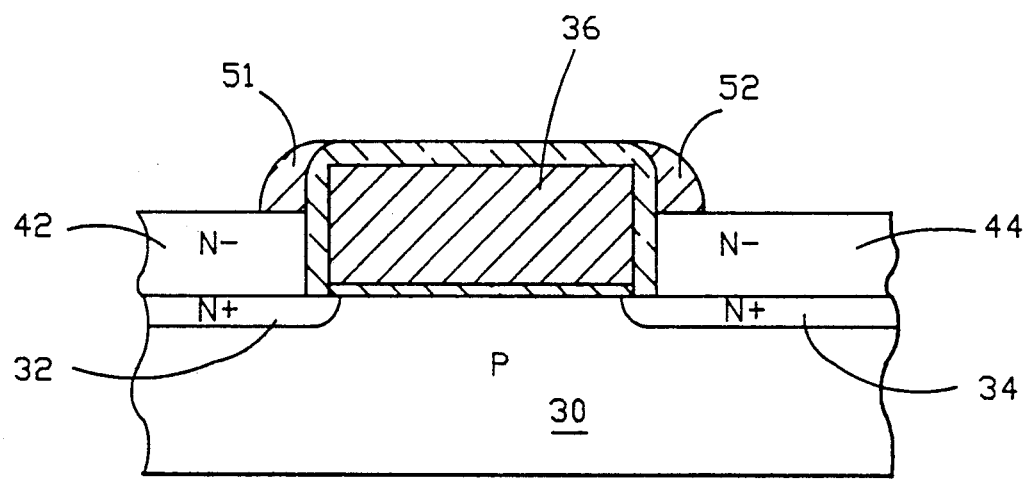
FIG.—4B
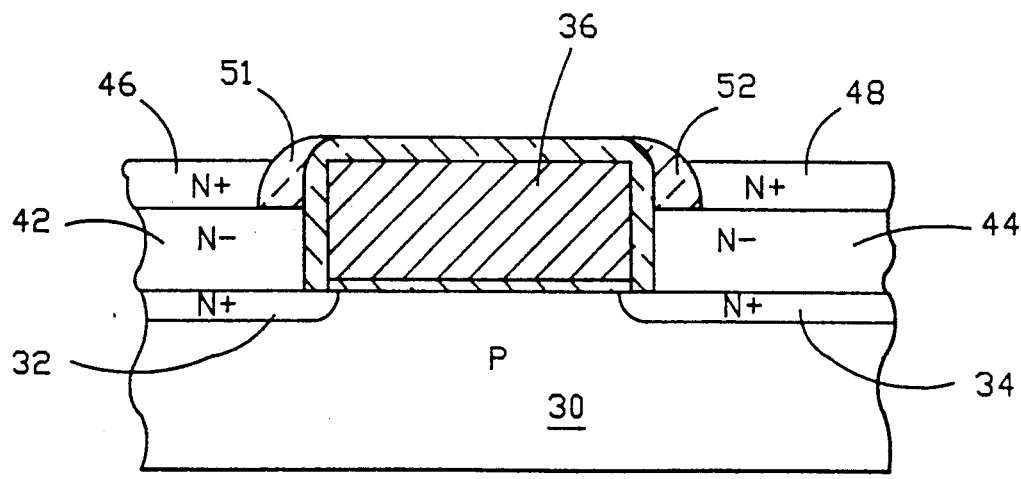
FIG.—4C

HOT-CARRIER SUPPRESSED SUB-MICRON MISFET DEVICE

BACKGROUND OF THE INVENTION

This invention relates generally to semiconductor technology, and more particularly the invention relates to Metal-Insulator-Semiconductor Transistors (MISFETs), including Metal-Oxide-Semiconductor Field-effect Transistors (MOSFETs), built in integrated circuits based on sub-micron design rules and methods of making the same.

The MISFET structure includes two spaced doped regions, called source and drain, separated by a region called the channel. Conduction of current from the source to the drain through the channel is controlled by a voltage applied to a gate electrode (e.g., metal or doped polysilicon, for example) positioned above the channel and separated therefrom by an insulator such as silicon oxide. In an enhancement mode transistor, the source and drain are of one conductivity type, such as N-type, and the channel is of opposite conductivity type, such as P-type. In the N-channel enhancement mode transistor, a positive voltage is applied to the gate electrode which causes electrons to migrate to the underlying surface of the channel region while positive carriers, or holes, are repulsed therefrom. The channel then becomes conductive and current flows from the source to the drain.

A recognized problem in MISFET devices having narrow spacing between the source and drain stems from high electrical fields, particularly near the drain, which result in hot-carrier injection from the channel and drain/source regions into the gate insulator, or hot-carrier induced generation of interface states at the gate insulator-semiconductor interface region, which degrades the device transconductance. Some of the electrons in the channel current gain sufficient energy to overcome the oxide barrier and are injected into the oxide. Trapping of electrons in the gate oxide leads to threshold voltage instability and degraded device performance.

Heretofore, the problem of "hot carrier" degradation in MISFET structures having channel lengths of 0.5-5.0 microns has been suppressed through use of a lightly doped drain (LDD) structure as disclosed, for example, by Takeda et al. "Submicrometer MOSFET Structure For Minimizing Hot-Carrier Generation", *I.E.E.E. Transactions on Electron Devices*, Volume Ed - 29, No. 4, April 1982, pp. 611-618. The LDD structure consists of lightly doped source/drain regions beneath the gate electrode at the edges of the gate electrode and adjacent to heavily doped source/drain regions which are laterally displaced from the gate electrode or lie slightly beneath the edges of the gate electrode. The lightly doped region, which is driven just under the gate electrode, minimizes the generation of hot carriers, and the heavily doped region provides a low resistance region which is easily contacted.

The insertion of the lightly doped region between the channel and the heavily doped region results in a graded dopant impurity profile which reduces the peak electric field. However, the dopant profile must satisfy certain boundary conditions in minimizing the peak electric field as well as moving the peak electric field beneath the edge of the gate electrode. This has become increasingly difficult to achieve as gate lengths are reduced below 0.5 micron.

SUMMARY OF THE INVENTION

Accordingly, an object of the invention is an improved MISFET structure having a gate length below 0.5 micron.

Another object of the invention is suppression of hot-carrier degradation in a MISFET device fabricated in integrated circuits based on design rules below 0.5 micron.

Still another object of the invention is a method of making an improved MISFET structure.

A feature of the invention is the use of a more heavily doped, steeply profiled source or drain region abutting the channel region with a lighter doped source or drain region spaced from the channel region.

Another feature of the invention is a source or drain structure in which a more heavily doped region is formed in a surface of a semiconductor body and a lighter doped region is formed over the more heavily doped region.

In accordance with a preferred embodiment of the invention, shallow, more heavily doped, steeply profiled source and drain regions are formed in the surface of a semiconductor body using gate electrode self-alignment. Thereafter, a lighter doped epitaxial layer is selectively grown over the more heavily doped source and drain regions thus establishing the dopant grading and magnitude of the source and drain regions to minimize hot carrier generation. A heavily doped epitaxial layer can then be grown over the lighter doped epitaxial layer for source and drain contacts. Alternatively, the lighter doped, selectively grown epitaxial layer can be made thicker. Then the heavily doped region in the epitaxial layer can be formed by an N+ ion implant followed by a brief thermal anneal.

In alternative embodiments, the epitaxial layers can be replaced by doped polycrystalline semiconductor material, doped amorphous semiconductor material, or by a wider band gap semiconductor material.

The lighter doped source and drain regions reduce the voltage drop across the more heavily doped regions in the semiconductor body, thereby reducing the electric field therein. Further, the reduction in doping level between the more heavily doped region and the lighter doped region contributes to reduced electric field due to energy band bending associated with the change in doping levels. The structure exhibits improved long term reliability particularly in sub-micron devices.

The invention and objects and features thereof will be more readily apparent from the following detailed description and dependent claims when taken with the drawing.

BRIEF DESCRIPTION OF THE DRAWING

FIGS. 4A-4D are on section views illustrating alternative steps in the process of FIGS. 3A-3G.

DETAILED DESCRIPTION OF ILLUSTRATED EMBODIMENTS

Figure 1:
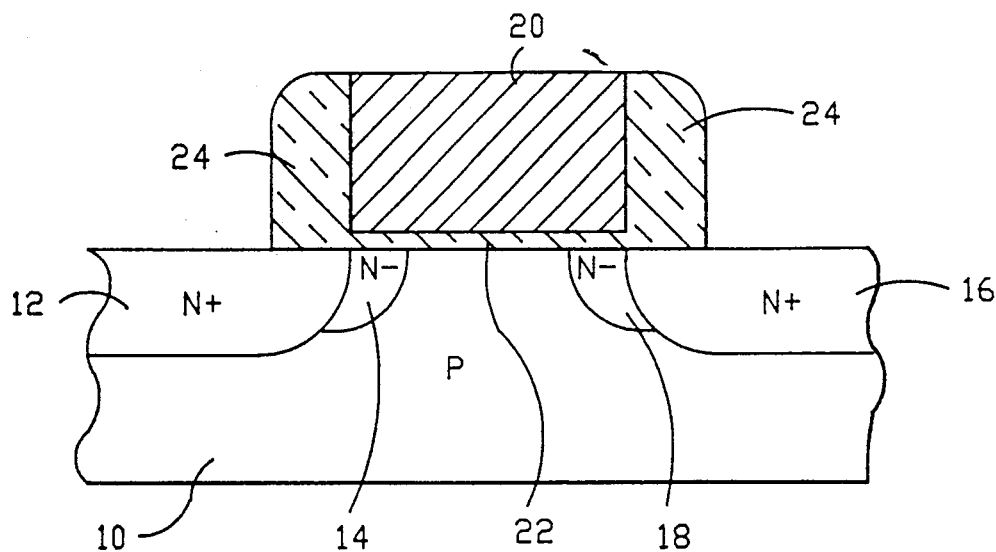
FIG. 1 is a section view of a lightly doped drain MISFET structure in accordance with the prior art.

Referring now to the drawing, FIG. 1 is a section view of a lightly doped drain (LDD) MISFET structure in accordance with the prior art as disclosed by Takeda et al., supra, and in U.S. Pat. No. 4,753,898 for "LDD CMOS PROCESS". In this embodiment, an N− channel enhancement mode transistor is fabricated in a p-doped silicon substrate 10. The source includes an N+ doped region 12 and a more lightly doped N− region 14. Similarly, the drain region includes a heavily doped N+ region 16 and a more lightly doped N− region 18. The substrate region between the lightly doped N− regions 14, 18 comprises the channel of the transistor, and a gate electrode 20 overlies the channel region and the N− doped regions 14, 18, and is separated therefrom by insulator material 22. Sidewall insulating spacers 24 are provided at either side of the gate electrode 20 and can be utilized in the formation of the source and drain regions as disclosed in U.S. Pat. No. 4,753,898, supra.

The LDD MISFET structure shown in FIG. 1 has proven successful in conventional 0.5–1.2 micron MOS integrated circuits. In such structures, the source/drain junction depth is in the range of 0.15–0.35 micron. The insertion of the N− region between the p-type channel and the N+ region results in a more graded (i.e., less steeply sloping) N-type impurity profile so that the peak electric field is reduced. This reduces impact ionization and hot carrier generation sufficiently to result in MISFET devices and MOS integrated circuits with acceptable reliability. However, this goal is not achieved without adjusting the N− impurity profile and the N+ impurity according to several boundary conditions which are required in minimizing the peak electric field as well as locating the peak electric field beneath the edge of the gate electrode. These boundary conditions are as follows:

1. For a given N+ junction depth, the maximum width of the side wall oxide spacer is limited by the requirement that the peak lateral electric field shall be located beneath the gate electrode. For this condition to be satisfied, the edge of the N+ region must lie beneath the edge of the gate electrode.

2. For a given N− junction depth, the minimum length of the N− region beneath the gate electrode is limited by the fact that it must be sufficiently long to keep the peak electric field from being too high. The maximum length of the N− region is limited by the amount of lateral diffusion (approximately 75% of the N− junction depth) beneath the gate electrode.

3. The maximum N− doping concentration at or near the surface is around $10^{18}$ atoms $cm^{-3}$ and is limited by undesired band-to-band tunneling current due to the transverse electric field which is induced by the gate electrode.

4. The minimum N− doping concentration is limited by the requirement that the peak lateral electric field should lie beneath the gate electrode.

In attempting to apply the LDD MISFET structure in devices having a physical gate length in the range of 0.25–0.35 micron, the junction depth of the N− region should be less than 750 angstroms in order to avoid undesirable charge-sharing effects which result in unacceptably large variations in the device electrical characteristics. This is due to the fact that junction depths greater than 750 angstroms result in less steep (or more sloping) profiles which then began to extend more into the channel region, thereby compensating more of the channel doping. However, if the junction depth is extremely shallow (less than 750 angstroms), the LDD device structure is not able to satisfy the above criteria which are necessary to suppress undesired hot-carrier effects.

In accordance with the present invention, a novel MISFET structure is provided which allows extremely shallow, steeply profiled junctions and still allows the hot-carrier effect to be adequately suppressed to ensure satisfactory device and integrated circuit reliability. A key feature of the structure in accordance with the invention is the use of a more heavily doped, steeply profiled source or drain region abutting the channel region with a lighter doped source or drain region spaced from the channel region. In a preferred embodiment, the more heavily doped region is formed in the surface of a semiconductor body, and the lighter doped region is formed over the more heavily doped region.

Figure 2:
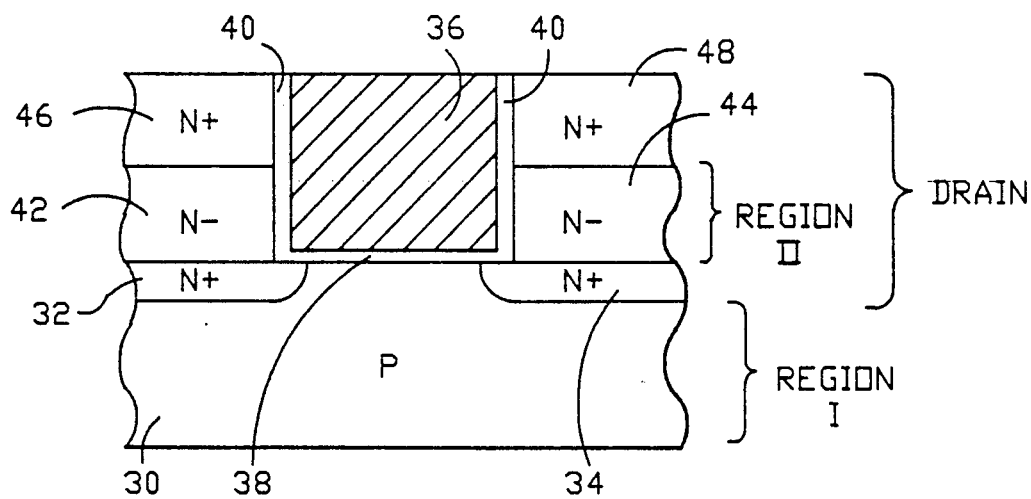
FIG. 2 is a section view of a sub-micron MISFET device in accordance with one embodiment of the present invention.

FIG. 2 is a section view of a MISFET structure in accordance with one embodiment of the invention. In this embodiment an N-channel enhancement mode transistor is illustrated; however, it will be appreciated that the invention is applicable to P-channel enhancement mode transistors also. The invention is also applicable to depletion mode N-channel and P-channel transistors. Referring to FIG. 2, a P-doped silicon substrate 30 has shallow source and drain N+ regions 32 and 34 formed therein. The depth of regions 32, 34 is on the order of 300–600 angstroms, and the channel region therebetween is on the order of 0.10–0.35 micron. Gate electrode 36 is formed over the channel region and overlaps the N+ regions 32, 34. The gate electrode is separated from the channel region by an insulator layer 38, and insulating side wall spacers (for example, silicon dioxide) 40 are provided on either side of the gate electrode.

Formed over the N+ regions 32, 34 are N− regions 42 and 44 which are selectively epitaxially grown on the surface of substrate 30. The peak dopant concentration of N+ regions 32, 34 at the interface with regions 42 and 44 is on the order of $10^{18}$ atoms per cubic centimeter, while the dopant concentration in the epitaxial layers 42, 44 is substantially lower at $10^{15}$ to $5 \times 10^{16}$ atoms per cubic centimeter. In order to provide a low ohmic contact to the source and drain regions, second epitaxial layers 46 and 48 are grown over epitaxial layers 42 and 44 with the epitaxial layers 46 and 48 having a dopant concentration on the order of $10^{20}$ atoms per cubic centimeter. The thickness of the epitaxial layers 42, 44, 46, 48 is on the order of 1000 angstroms. In alternative embodiments, the epitaxial layers can be replaced by doped amorphous or polycrystalline semiconductor material. Also, the second epitaxial layers 46, 48 can be replaced by making the first epitaxial layers 42, 44 thicker. Then the heavily doped regions represented by 46 and 48 can be formed by an N+ ion implant followed by a brief thermal anneal.

When the device is biased with the drain at a relatively high positive voltage relative to the source, and when the applied gate voltage exceeds the threshold voltage, current (i.e., electrons) will flow from the source to the drain. The electrons will encounter a very high electric field in the N+ doped regions 32, 34 and quickly acquire considerable additional energy. If the overlying regions 42, 44 were of the same or higher doping level compared to the underlying N+ regions (as in a conventional MISFET structure), a larger voltage would be dropped across the N+ region, leading to larger electric fields in the N+ regions. However, with the doping level in the epitaxial layers 42, 44 being substantially below the dopant level in the N+ regions 32, 34, less voltage is dropped across the N+ regions, and a larger part of the drain voltage is dropped across the epitaxial layers 42, 44. As a consequence, the electric field is appreciably reduced in the N+ layers. Since the impact ionization depends exponentially on electric field, the impact ionization rate is substantially reduced. Further, the reduction in doping level from the N+ region to the N− regions contributes to reduced electric field because of the energy band bending associated with the change in doping level from N+ to N−. The beneficial energy band bending can also be realized by using a wider band gap material in the N− region. The material should be closely lattice matched to silicon. Gallium phosphide (GaP) is an example of such a material. Thus, the resulting MISFET device has improved long-term reliability which has been a very critical problem in small sub-micron devices.

Figure 3A:
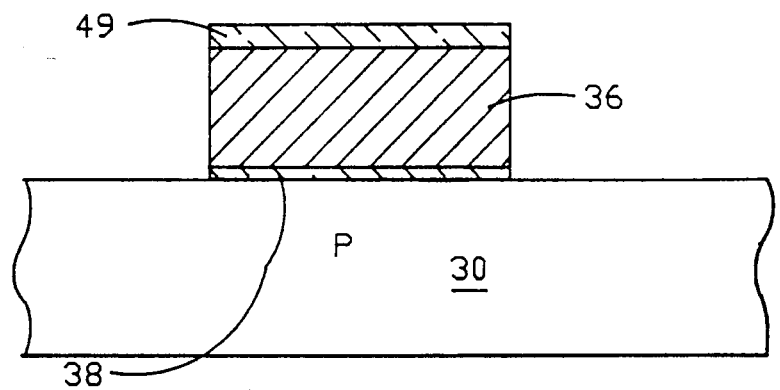
FIGS. 3A-3G are section views illustrating the fabrication of the device of FIG. 2.

The structure of FIG. 2 is readily fabricated using a unique combination of conventional semiconductor processing techniques as illustrated for an N-channel device in the section views of FIGS. 3A-3G. In FIG. 3A the p-doped silicon body 30 has a gate oxide 38 formed on the surface thereof with the gate electrode 36 formed on the oxide 38. Gate 36 can comprise doped polysilicon, a doped polysilicon silicide sandwich, or a metal, for example. Gate electrode 36 has a layer 49 of silicon dioxide or silicon nitride on top of it, which will serve to prevent epitaxial growth on the gate electrode in a later step. It is assumed that the channel doping level has been set by an earlier threshold voltage implant or by substrate doping, or by a combination of the two. The silicon body can be a silicon substrate or can comprise a silicon epitaxial layer grown on a silicon substrate.

Figure 3B:
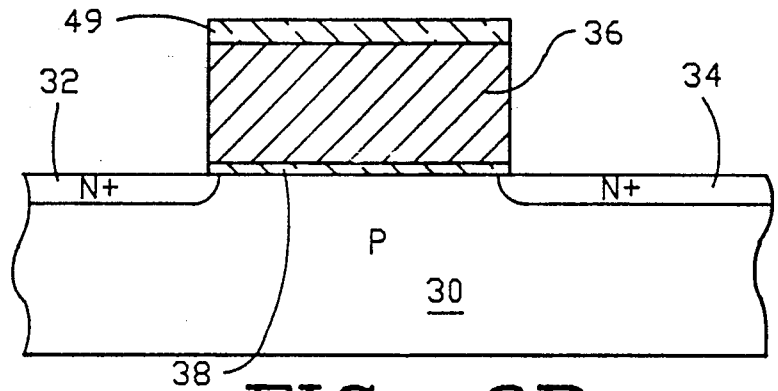
Figure 3C:
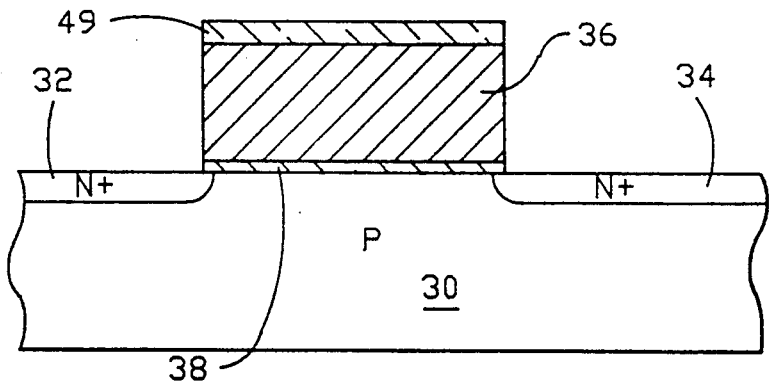

In FIG. 3B the N+ source and drain regions 32, 34 are formed by ion implant. The implant is extremely shallow and can be accomplished by an arsenic implant using 10-30 keV acceleration and a dose in the range of $1-10 \times 10^{12}$ ions cm$^{-2}$ Thereafter, as shown in FIG. 3C, the structure is thermally annealed to electrically activate the implanted ions and move the junction of the source and drain to several hundred angstroms depth with a steep profile.

Figure 3D:
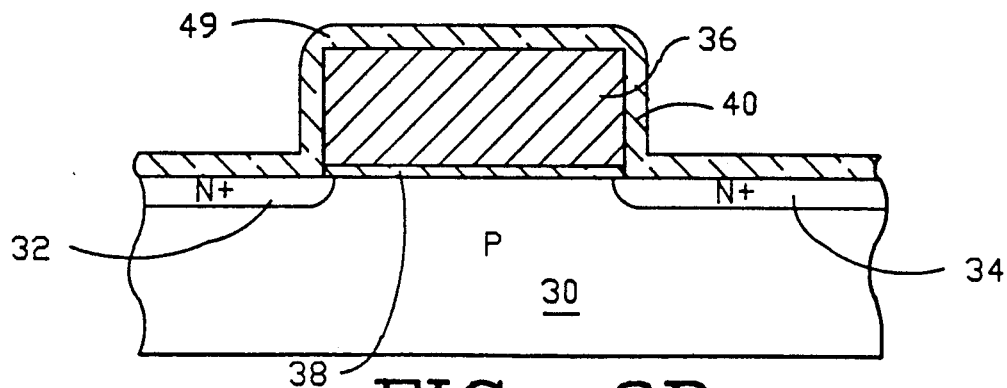
Figure 3E:
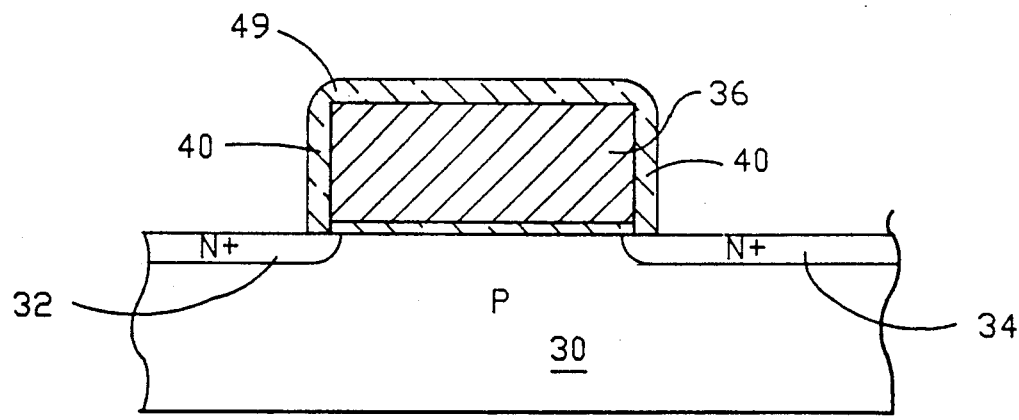
Figure 3F:
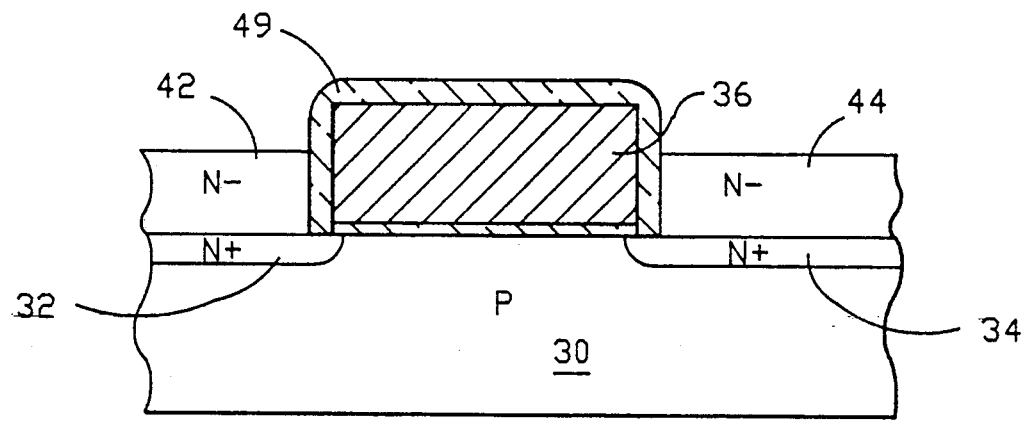

Next, as shown in FIG. 3D, side wall spacer oxide 40 is formed to a thickness of 100–500 angstroms. This may be thermally grown or deposited oxide or a combination of the two. This process increases the thickness of layer 49 so that it is thicker than the part of layer 40 that overlies the source and drain regions. If the oxide is thermally grown, then the thermal treatment involved can be used in forming the source/drain junctions. Formation of the side wall spacer oxide 40 is followed by an anisotropic etch to remove the oxide formed in the planar areas above the source and drain regions but leaving the side wall oxide, as shown in FIG. 3E. Also, since layer 49 is thicker than the part of layer 40 that overlies the drain and source regions (32 and 34), the anisotropic etch can be performed so that part of layer 49 remains even though layer 40 is removed from the source and drain regions.

Thereafter, the N− epitaxial layers 42 and 44 are selectively grown to a thickness of 500-1500 angstroms with the doping level preferably set during growth, i.e., in situ arsenic doping to a level of $10^{15}$cm$^{-3}$ to $5 \times 10^{16}$cm$^{-3}$. The doping level can also be set by ion implantation of impurities followed by a brief thermal anneal. Rapid thermal processing can be employed to minimize the thermal budget of the process step and minimize dopant diffusion during the epitaxial growth. The selective epitaxial growth is such that epitaxial growth occurs only where silicon surfaces are exposed.

Figure 3G:
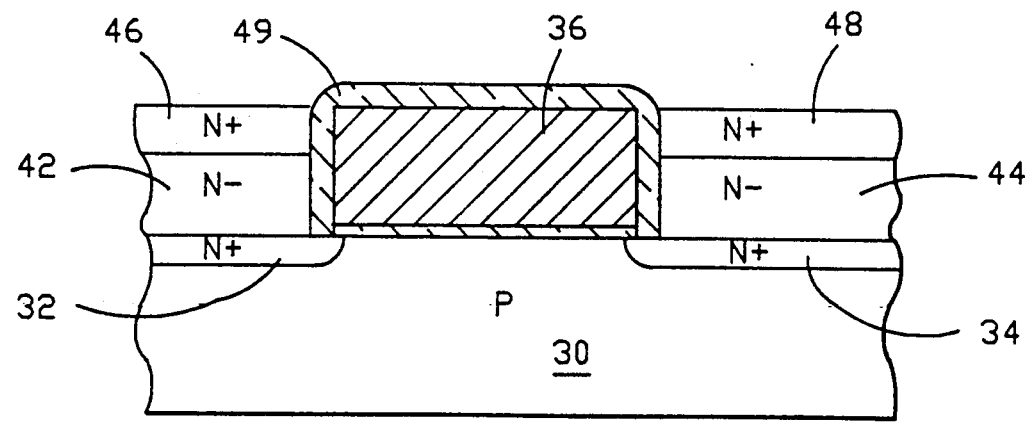

Next, as shown in FIG. 3G, the heavily doped epitaxial layers 46 and 48 are selectively grown over the epitaxial layers 42, 44 to a thickness of 1000-4000 angstroms. Again, a minimal thermal budget is required in order to maintain the very shallow, steep profiled junctions in the N+ regions of the source and drain. In an alternative process, the heavily doped single crystal layer can be formed by growing a thicker lightly doped single crystal silicon layer and performing a high dose N+ implant (e.g., arsenic) into the top portion of the thicker epitaxial layer followed by brief thermal treatment to electrically activate the implant but minimize the arsenic diffusion.

Finally, a silicide layer is formed on the heavily doped single crystal layer in order to obtain low sheet resistance source/drains and low contact resistance. It will be appreciated that the process steps illustrated in FIGS. 3A-3G are for an N-channel MISFET device, and a similar type approach can be used for a P-channel MISFET device by using the appropriate implant dopant species and thermal treatment. Further, while the illustrated embodiment utilizes epitaxial layers over both the source and drain region, the invention can be practiced with an epitaxial layer over the drain only. Finally, this type of structure can be realized in different semiconductors.

FIGS. 4A-4D are section views illustrating alternative steps in the process of FIGS. 3A-3G, and in particular FIGS. 4A-4C and FIG. 4D replace FIG. 3G. Like elements have the same reference numerals This embodiment reduces the capacitance between the source and gate and the capacitance between the drain and gate. This is accomplished by adding another sidewall insulator spacer to the structure after the N− epitaxial layer 44 is grown and before the N+ epitaxial layer 48 is grown.

Figure 4D:
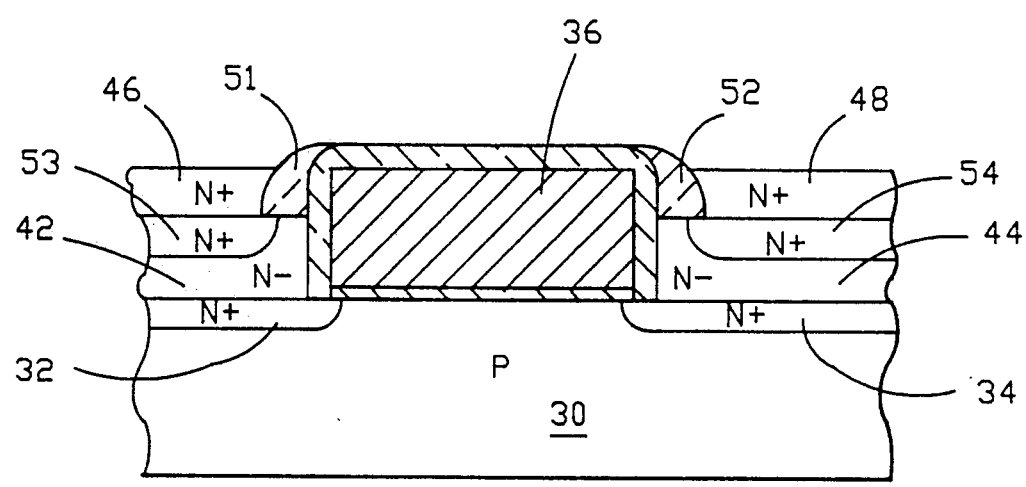

Referring to FIG. 4A, an insulator 50 such as silicon oxide is deposited over the silicon oxide layer 49 and the N− layer 42, 44. The deposited layer 50 has a thickness between 200 and 1500 angstroms. Thereafter, as illustrated in FIG. 4B the layer is anisotropically etched to remove the deposited material overlying the epitaxial layers 42, 44 while the material remains over the gate electrode 36. The anisotropic etch forms spacers 51 and 52. Finally, as shown in FIG. 4C the epitaxial growth of the N+ layers 46, 48 is performed, thereby providing a structure similar to the structure of FIG. 3G. An additional process step may be inserted just prior to the formation of the N+ layers 46 and 48 in order to help to reduce the series resistance in the structure. An N− type ion implant may be performed into layers 42 and 44 after the sidewall oxide 51 and 52 is formed. This allows the heavily doped regions 46 and 48 to extend down into layers 42 and 44 except where layers 42 and 44 are covered by the sidewall oxide 51 and 52. The resulting structure is shown in FIG. 4D in which this ion implanted region is designated by the numbers 53 and 54. The implanted N+ regions 53, 54 can extend to the N+ regions 32, 34 as long as the N− regions 42, 44 separate the implanted N+ regions from the silicon oxide layer 49 at the interface with the N+ regions 32, 34.

Figure 5:
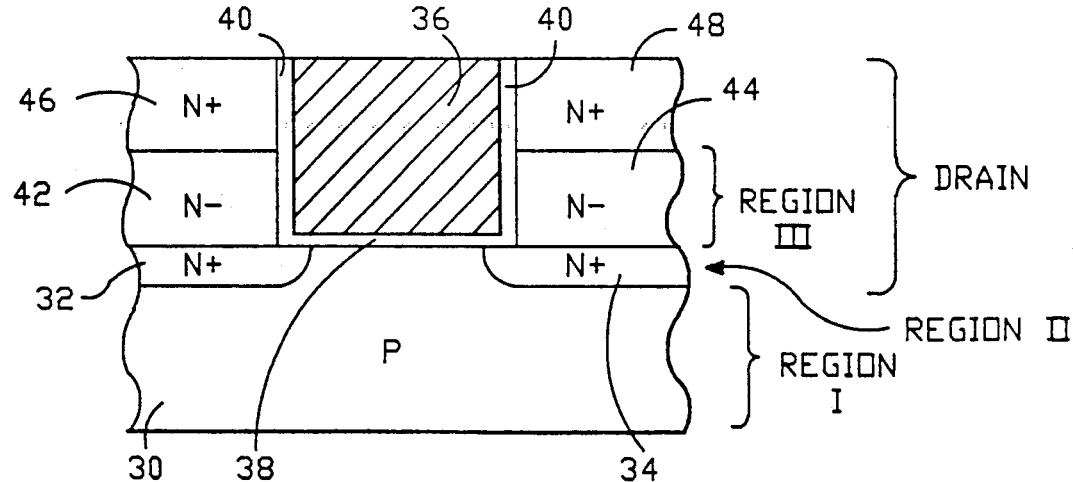
FIG. 5 is a section view of a MISFET device in accordance with another embodiment of the invention.

FIG. 5 is a section view of a MISFET device in accordance with another embodiment of the invention. The structure is similar to the structure of FIG. 2, and like elements have the same reference numerals. However, in this embodiment, the transistor is an N-channel depletion mode transistor. The device is fabricated in a P− doped silicon substrate 30. However, the threshold voltage is adjusted by ion implantation, phosphorus or arsenic for example, or other known processing techniques to make the transistor depletion mode in operation. It will be appreciated that the net dopant conductivity of the channel region can be N− but need not be N− in order to function in depletion mode. Again, the invention is also applicable to a P-channel depletion mode. Except for the channel doping, all elements of the MISFET of FIG. 4 are the same as the like elements in FIG. 2.

The MISFET structure in accordance with the invention has proved successful in minimizing hot carrier instability in sub-micron structures based on design rules below 0.5 micron. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

We claim:

1. A sub-micron MISFET structure comprising a doped semiconductor body, doped source and drain regions formed in a major surface of said semiconductor body with a channel region therebetween, a gate overlying said channel region and spaced therefrom by a layer of insulative material, and a first additional doped region abutting said drain region away from said channel region and forming part of the drain element of the MISFET structure, said additional doped region being of the same conductivity type as said drain region, and the dopant concentration in said additional region being less than the dopant concentration in said drain region.

2. The MISFET structure as defined by claim 1 and further including a second additional doped region abutting said first additional doped region, the dopant concentration in said second additional doped region being greater than the dopant concentration in said first additional doped region.

3. The MISFET structure as defined by claim 2 wherein said semiconductor body comprises silicon, said first additional region comprises silicon, and said second additional region comprises silicon.

4. The MISFET structure as defined by claim 2 and further including a third additional doped region abutting said source region away from said channel region and forming part of the source element of the MISFET structure, said third additional doped region being of the same conductivity type as said source region, and the dopant concentration in said third additional region being less than the dopant concentration in said source region.

5. The MISFET structure as defined by claim 4 and further including a fourth additional doped region abutting said third additional doped region, the dopant concentration in said fourth additional doped region being greater than the dopant concentration in said third additional doped region.

6. The MISFET structure as defined by claim 5 wherein said semiconductor body and said first, second, third, and fourth additional doped region comprise silicon.

7. The MISFET structure as defined by claim 6 wherein said first, second, third, and fourth additional doped regions are adjacent to said gate contact and are spaced therefrom by a dielectric layer.

8. The MISFET structure as defined by claim 7 wherein said dielectric layer comprises silicon oxide.

9. The MISFET structure as defined by claim 7 wherein said dielectric layer between said second and fourth additional doped layers and said gate contact is thicker than between said first and third additional doped layers and said gate contact.

10. The MISFET structure as defined by claim 1 wherein said first additional doped region is a first epitaxial layer grown on said drain region.

11. The MISFET structure as defined by claim 10 and further including a second epitaxial layer grown on said first epitaxial layer, said second epitaxial layer having a dopant concentration greater than the dopant concentration of said first epitaxial layer and functioning as a low ohmic contact to said drain region.

12. The MISFET structure as defined by claim 11 wherein said structure comprises a depletion mode transistor.

13. The MISFET structure as defined by claim 11 wherein said semiconductor body and said doped source and drain regions have opposite conductivity type.

14. The MISFET structure as defined by claim 13 wherein said structure comprises an enhancement mode transistor.

15. The MISFET structure as defined by claim 1 wherein said first additional doped region comprises doped polycrystalline semiconductor material.

16. The MISFET structure as defined by claim 15 and further including a second additional doped region comprising doped polycrystalline semiconductor material the dopant concentration in said second additional doped region being greater than the dopant concentration is said first addition doped region.

17. The MISFET structure as defined by claim 1 wherein said first additional doped region comprises doped amorphous semiconductor material.

18. The MISFET structure as defined by claim 17 and further including a second additional doped region comprising doped amorphous material, the dopant concentration in said second additional doped region being greater than the dopant concentration is said first addition doped region.

19. The MISFET structure as defined by claim 1 wherein said semiconductor body is silicon and said first additional region comprises a wider band gap material.

20. The MISFET structure as defined by claim 19 wherein said wider band gap material comprises gallium phosphide.

21. The MISFET structure as defined by claim 1 wherein said semiconductor body is silicon and said first additional region comprises silicon.

22. The MISFET structure as defined by claim 1 wherein said drain region is heavily doped with a steep dopant profile with respect to said channel region.

23. A sub-micron MISFET device structure comprising a semiconductor body of one conductivity type, source and drain regions of opposite conductivity type formed in a major surface of said semiconductor body with a channel region therebetween, a gate overlying said channel region and spaced therefrom by a layer of insulative material, and an epitaxial layer of opposite conductivity type grown on said drain region, the dopant concentration in said epitaxial layer being less than the dopant concentration in said drain region.

24. The sub-micron MISFET device structure as defined by claim 23 and further including a second epitaxial layer of opposite conductivity type grown on said first epitaxial layer, the dopant concentration in said second epitaxial layer being greater than the dopant concentration in said first epitaxial layer and functioning as a low ohmic contact to said drain region.

25. The submicron MISFET device structure as defined by claim 24 wherein said first and second epitaxial layers are adjacent to said gate contact and separated therefrom by a dielectric layer.

26. The MISFET structure as defined by claim 25 wherein said dielectric layer is thicker between said second epitaxial layer and said gate contact than between said first epitaxial layer and said gate contact.

27. A sub-micron MISFET structure comprising
  a. a semiconductor body of one conductivity type having a major surface,
  b. first and second spaced doped regions of opposite conductivity type in said surface of said semiconductor body and defining a channel region therebetween,
  c. an insulative layer on said surface between said first and second spaced doped regions,
  d. a gate electrode positioned on said insulative layer, and
  e. a third doped region of said opposite conductivity type abutting said first region, the dopant concentration in said third region being less than the dopant concentration in said first region.

28. The MISFET structure as defined by claim 27 wherein said third region comprises an epitaxial layer grown on said first region.

29. The MISFET structure as defined by claim 28 wherein said first and second regions have a depth of less than 700 angstroms, said epitaxial layer being on the order of 1000 angstroms in thickness.

30. The MISFET structure as defined by claim 29 wherein the dopant concentration in said first and second regions has a peak on the order of $10^{18}$ atoms per cubic centimeter, and the dopant concentration in said epitaxial layer is on the order of $10^{15}$–$5\times 10^{16}$ atoms per cubic centimeter.

31. The MISFET structure as defined by claim 30 and further including a second epitaxial layer grown on said first epitaxial layer, the dopant concentration of said second epitaxial layer being greater than the dopant concentration of said first epitaxial layer, said second epitaxial layer functioning as a low ohmic contact to said drain region.

32. A MISFET structure comprising
  (a) a semiconductor body of one conductivity type having a major surface,
  (b) first and second spaced doped regions of opposite conductivity type in said surface of said semiconductor body and defining a channel region therebetween,
  (c) an insulative layer on said surface between said first and second spaced doped regions,
  (d) a gate positioned on said insulative layer, and
  (e) third and fourth doped regions of said opposite conductivity type abutting said first and second regions, respectively, the dopant concentration in said third and fourth regions being less than the dopant concentration in said first and second regions.

33. The MISFET structure as defined by claim 32 wherein the length of said channel region between said first and second regions is less than one-half micron, said third and fourth regions comprising first and second epitaxial layers grown on said first and second regions, respectively.

34. The MISFET structure as defined by claim 33 wherein said first and second regions have a depth of less than 700 angstroms, said first and second epitaxial layers being on the order of 1000 angstroms in thickness.

35. The MISFET structure as defined by claim 34 wherein the dopant concentration in said first and second regions has a peak on the order of $10^{18}$ atoms per cubic centimeter, and the dopant concentration in said first and second epitaxial layers is on the order of $10^{15}$–$5\times 10^{16}$ atoms per cubic centimeter.

36. The MISFET structure as defined by claim 35 and further including third and fourth epitaxial layers grown on said first and second epitaxial layers, respectively 37. The MISFET structure as defined by claim 36 wherein the thickness of said third and fourth epitaxial layers is on the order of 1000 angstroms and the dopant concentration of said third and fourth epitaxial layers is on the order of $10^{20}$ atoms per cubic centimeter, said third and fourth epitaxial layers functioning as low ohmic contacts to said source and drain regions.

38. The MISFET structure as defined by claim 37 wherein said one conductivity type is p type and said dopant of opposite conductivity type in said first and second regions and in said epitaxial layers is arsenic.

39. The MISFET structure as defined by claim 37 wherein said semiconductive body comprises a silicon substrate.

40. The MISFET structure as defined by claim 32 wherein said semiconductive body comprises a silicon epitaxial layer grown on a silicon substrate.

41. The MISFET structure as defined in claim 9 wherein said second and fourth doped regions extend into said first and third regions, respectively, to reduce series resistance between said second and fourth doped regions and said drain and source regions, respectively.

42. The MISFET structure as defined by claim 41 wherein said first and fourth doped regions extend into said and third doped regions, respectively, outside of said dielectric layer between said second and fourth doped regions and said gate contact.

43. The MISFET structure defined by claim 26 wherein said second and fourth doped regions extend into said first and third regions, respectively, to reduce series resistance between said second and fourth regions and said drain and source regions, respectively.

44. The MISFET structure as defined by claim 43 wherein said second and fourth doped regions extend into said first and third doped regions, respectively, outside of said dielectric layer between said second and fourth doped regions and said gate contact.

* * * * *